(12) United States Patent
Ruelke et al.

(10) Patent No.: US 7,689,217 B2
(45) Date of Patent: Mar. 30, 2010

(54) RADIO RECEIVER HAVING A MULTI-STATE VARIABLE THRESHOLD AUTOMATIC GAIN CONTROL (AGC) FOR FAST CHANNEL SCANNING ACQUISITION AND MEHTOD FOR USING SAME

(75) Inventors: Charles R. Ruelke, Margate, FL (US); William J. Rinderknecht, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 539 days.

(21) Appl. No.: 11/694,697

(22) Filed: Mar. 30, 2007

(65) Prior Publication Data

US 2008/0240312 A1 Oct. 2, 2008

(51) Int. Cl.
*H04Q 7/20* (2006.01)
(52) U.S. Cl. .................. 455/434; 455/161.2; 455/166.2; 455/234.1
(58) Field of Classification Search .............. 455/161.3, 455/168.1, 164.1, 164.2, 165.1, 166.1, 166.2, 455/161.1, 161.2, 226.1, 226.2, 184.1, 245.1, 455/232.1, 234.1, 234.2, 240.1, 434
See application file for complete search history.

(56) References Cited

U.S. PATENT DOCUMENTS

| | | | |
|---|---|---|---|
| 4,431,875 A | 2/1984 | Simokat | |
| 5,199,109 A * | 3/1993 | Baker | 455/161.2 |
| 5,511,235 A | 4/1996 | Duong et al. | |
| 5,555,451 A * | 9/1996 | Kennedy et al. | 455/161.2 |
| 5,574,995 A * | 11/1996 | Masaki | 455/161.2 |
| 5,742,899 A | 4/1998 | Blackburn et al. | |
| 5,758,274 A | 5/1998 | Vu et al. | |
| 5,864,752 A * | 1/1999 | Pinder | 455/161.3 |
| 6,112,086 A * | 8/2000 | Wala | 455/434 |
| 6,668,164 B2 * | 12/2003 | Hughes | 455/234.1 |
| 7,099,641 B2 | 8/2006 | Bruckmann et al. | |
| 2008/0165949 A9 * | 7/2008 | Hancock | 379/387.01 |

OTHER PUBLICATIONS

PCT International Search Report Application No. PCT/US2008/056461 Dated August 14, 2008—11 pages.

* cited by examiner

*Primary Examiner*—Sujatha Sharma (57) ABSTRACT

A radio receiver (300) having a multi-state variable threshold automatic gain control (AGC) for fast channel scanning acquisition includes an amplifier (303) having an automatic gain control (AGC) for controlling the gain of a receiver analog signal. An analog-to-digital converter (ADC) (311) is used for converting the receiving analog signal to a digital signal while a digital signal processor (DSP) (325) operates to process the digital signal. A signal magnitude estimator (315) in an AGC controller (313) provides a signal strength estimate of the received signal. The AGC controller (313) then sets the receiver amplifier (303) for an open-loop AGC operational mode and sets a first threshold for triggering an interrupt service request (ISR). This ISR is provided the DSP (325) and the host processor (327) if a radio frequency (RF) signal is detected above a first threshold during a priority scan of a priority channel to minimize interruptions in audio during priority scan.

26 Claims, 3 Drawing Sheets

RADIO RECEIVER HAVING A MULTI-STATE VARIABLE THRESHOLD AUTOMATIC GAIN CONTROL (AGC) FOR FAST CHANNEL SCANNING ACQUISITION AND MEHTOD FOR USING SAME

FIELD OF THE INVENTION

The present invention relates generally to radio receivers and more particularly to fast detection of radio frequency (RF) signals during a channel scan or channel acquisition as used in the radio receiver.

BACKGROUND

Scanning for transmitting stations on channel when using a two-way radio transceiver is commonly known in the art. With the advent of receivers incorporating Digital Signal Processors (DSP), many different algorithms have been developed to effectively detect radio frequency (RF) energy on a channel for alerting a user to the activity. Each algorithm provides a particular method in scanning for such activity. For example, a standard or conventional scanning technique moves from channel to channel in some predetermined sequence to detect channel activity. In contrast, a priority scan allows the user to remain on one channel while the radio transceiver periodically checks one or more other channels designated as "priority" channels for activity. When activity is detected on a priority channel, the receiver will move to that channel in view of its "priority" designation. Carrier Sense Multiple Access (CSMA) protocols also depend on fast channel acquisition as part of the ALOHA strategy to detect and correct "collisions" created when two client transmitters both attempted to send a transmission packet at the same time. Those skilled in the art will recognize that Aloha, also called the Aloha method refers to a simple communications scheme in which each transmitter in a network sends data whenever there is a frame to send. If the frame successfully reaches the receiver, the next frame is sent. If the frame fails to be received at the destination, it is sent again. This protocol was originally developed at the University of Hawaii for use with satellite communication systems in the Pacific region To maximize the effectiveness of any scan strategy or channel acquisition protocol it is of paramount importance to determine if an RF modulated signal having correct signaling occupies the targeted channel as quickly as possible. An efficient channel acquisition should be accomplished while minimizing digital processing, current drain, and latency. Fast scan or channel acquisition capability reduces the time required to check a targeted RF channel, which correspondingly translates into reduced time to scan a complete scan list, reduced audio interruption caused when checking the priority channel, or a reduction in the opportunity of acquisition "misses" when executing an ALOHA channel acquisition. The first step in the execution of a scan sequence is to determine if there is any RF carrier of any type occupying the targeted RF channel. Given that in most cases a RF channel that is being checked will not have a signal of any type present, an initial channel activity check, or RF carrier detect, can mitigate the need for further processing, such as filtering and demodulation of channel noise, before continuing with the scan sequence. Most legacy scan sequences require digital processing of the receive channel necessitating a period when the receiver is listening for activity on an active channel and then moves to scan the next channel for potential channel activity. For digitally based scan sequences, it can require from 7 mS to 10 mS to determine the presence of RF signal once the RF carrier is present at the input of the receiver antenna. Therefore, the period needed for the receiver to move to the priority channel from an active channel, check for channel activity on the priority channel, and move back to the active channel if no activity is detected on the priority channel, necessitates up to 15 mS of "round trip time". This creates a gap or "hole" in the audio stream even though the receiver is switched back to the active channel very quickly. Typically for an audio hole to be undetectable by a user's ear, the hole must be approximately 5 milliseconds (mS) or less in duration.

Figure 1:
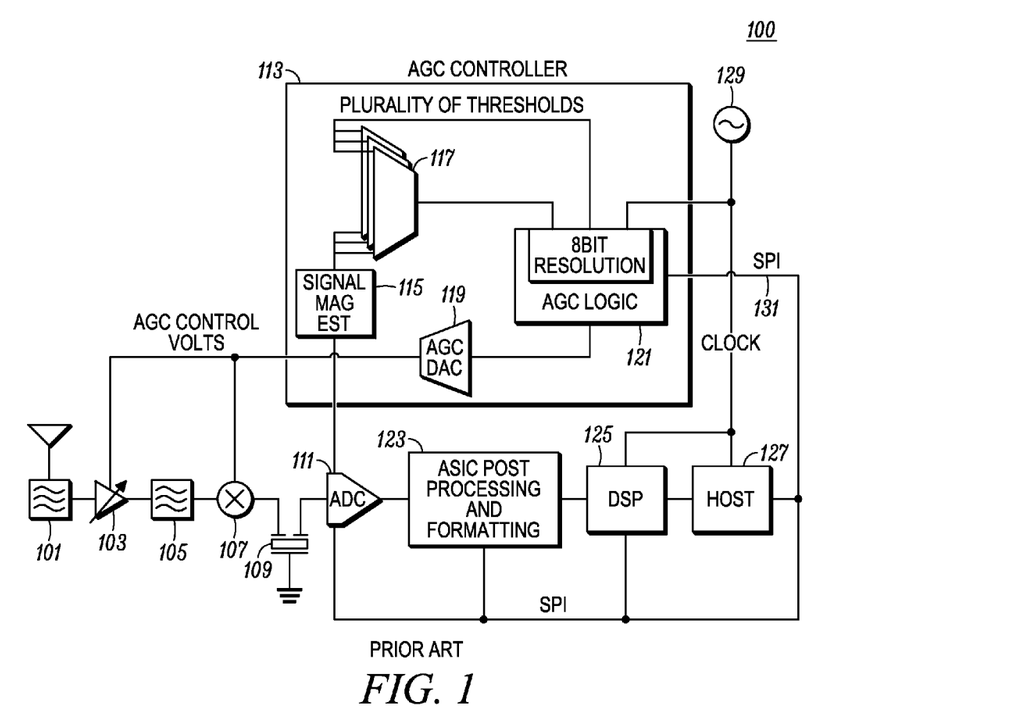
FIG. 1 illustrates a block diagram of a prior art receiver architecture in accordance with some embodiments of the invention.

A typical receiver topology utilizing a scanning function is illustrated in the prior art block diagram of FIG. 1. The receiver 100 includes a first filter 101 which receives an RF signal and supplies the signal to a low noise amplifier (LNA) 103. The LNA is a Variable Gain Amplifier (VGA) to support automatic gain control (AGC) functionality in order to prevent the RF energy at the front-end of the receiver from exceeding a predetermined range. The VGA gain is set by the AGC during closed loop operation by varying the output voltage of the digital-to-analog converter (DAC) 119 which is within a AGC controller 113. The amplified signal from LNA 103 is supplied to second filter 105 and a mixer 107. The down-mixed signal is then conveyed to filter 109 and subsequently converted to a digital signal by sampling the analog signal at the input of analog-to-digital converter (ADC) 111. The digital signal at the output of the ADC may then be post-processed by an application specific integrated circuit (ASIC) for decimation, filtering and formatting circuit 123, a digital signal processor (DSP) 125 and a host such as a microprocessor 127 for providing control functions.

The function of the AGC controller 113 is determined by the AGC logic 121 which translates information from the signal magnitude estimator to determine the output voltage of the AGC DAC 119. In operation, the signal magnitude estimator 115 receives information indicative of the received signal strength from the ADC 111 and conveys said information to a plurality of comparators 117, with each comparator having a specific threshold from a plurality of thresholds as set by AGC logic 121. The thresholds are supplied digitally with 8 bit resolution to the AGC logic 121 for the controlling operation of the LNA 103. The processing speed of AGC logic controller 121 and host 127 are may be proportional to a common clock source 129. The AGC logic, ADC, and ASIC processing characteristic are all programmable by the host though a serial port interface (SPI) port 131.

It should be evident to those skilled in the art that the receiver 100 is designed for autonomous AGC operation using the host 127 that is able to control the AGC thresholds 117 via SPI programming. The plurality of thresholds for the plurality of comparators 117 allows the AGC controller 113 to respond differently depending of the level of the RF present at ADC 111. Typically, these prior art AGC systems operate only to protect the receiver against very strong signal conditions at the receiver input where typically, only the last 8 most significant bits (MSBs) from a 16 bit ADC 111 are necessary to determine a range of attenuation for the LNA 103. The DSP 125 and host 127 continuously process the sampled data from ADC 111 for creating a signal in the digital domain by DSP processing. When used in connection with a scanning algorithm, the AGC acts only to control RF signal levels at the front end of the receiver and does nothing to mitigate audio holes generated when the receiver is scanning for active channel.

Figure 2:
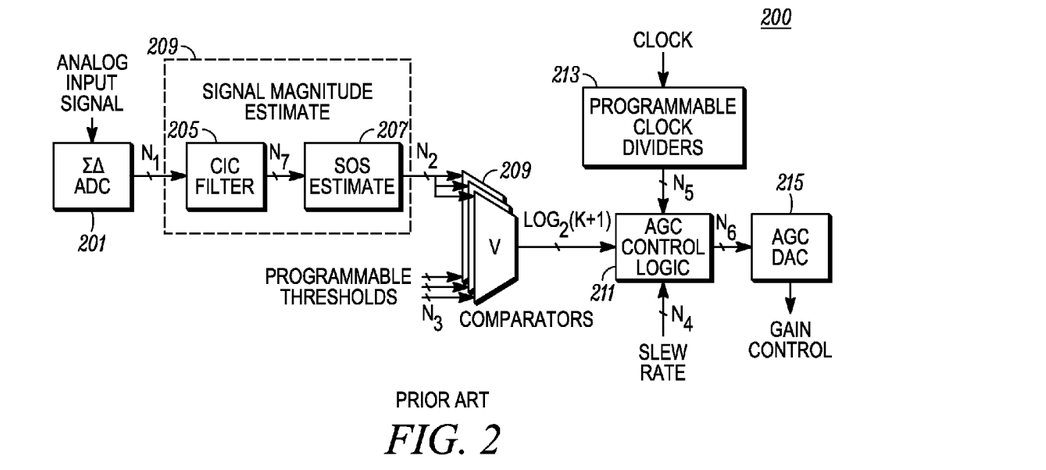
FIG. 2 illustrates a block diagram of a prior art automatic gain control system as used in FIG. 1.

FIG. 2 illustrates one specific type of implementation of the AGC control circuit like that shown in FIG. 1. The AGC control system 200 utilizes an analog input to a sigma-delta ADC 201 which in turn supplies a digital bit stream to a signal magnitude estimator 203. The signal magnitude estimator 203 includes a cascaded integrator comb (CIC) filter 205 which supplies a filtered input to a sum of squares (SOS) estimator 207. As will be evident to those skilled in the art, a sum of squares estimator utilizes the sum of the squares of the difference of a dependent variable and its grand mean to calculate an estimated value. This value is supplied to a plurality of comparators 209 that work with a series of programmable thresholds to provide a logarithmic output to AGC control logic 211.

Accordingly, the AGC control system 200 uses this logarithmic value along with a programmable clock divider 213 to provide an input to an AGC DAC 215. The output of the AGC DAC is then used to control the gain of an LNA like that shown in prior art FIG. 1. In operation, the AGC system 200 uses an architecture where a digital signal is created from an analog signal using the sigma delta ADC 201 where the signal magnitude estimator 203 determines an estimate of the digital signal's magnitude. This magnitude estimate is then fed to k comparators 209 which compare the signal magnitude to k programmable thresholds. Making k comparisons, the signal magnitude is determined to be within one of k+1 regions. This result is passed to the AGC control logic 211 which then determines if the AGC gain should be adjusted. The rate at which the gain is increased or decreased is set by slew rates determined by the programmable clock dividers 213. The resulting AGC gain value is set by adjusting the output voltage of the AGC DAC 215 which drives the adjustable gain of the system. A closed loop AGC system is therefore realized in that the level of the received signal at the input of the ADC 201 is determined by the gain of the receiver LNA, wherein the gain of the receiver LNA is set by the AGC DAC 215 as determined by the AGC control logic 211, wherein the AGC logic response is dictated by signal magnitude estimator 209 which estimates the signal level at the input of the ADC 201.

One of the limitations associated in using this type of topology for scan or channel acquisition is the processing latency associated with the ASIC and DSP to achieve carrier detect. Although this prior art topology provides for a very robust AGC control system for the LNA, it does nothing to mitigate the disruption in the audio when this topology is used in a priority scan mode, neither is it maximally efficient for carrier detect determination in CSMA or legacy scan sequences. In priority scan applications, the legacy receiver topologies and channel acquisition strategies elongate the "audio hole" created when checking the priority channel for a RF carrier, which negatively effects the radio operator's perception of the audio quality of the received signal. In addition, multiple retries in a CSMA system reduces system capacity thereby degrading overall capability. Consequently, the need exists to provide an optimum solution to reduce both the audio hole generated during prior scan and improve channel acquisition efficiency while using a strategy that is easily adaptable to existing receive topologies

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Before describing in detail embodiments that are in accordance with the present invention, it should be observed that the embodiments reside primarily in combinations of method steps and apparatus components related to a receiver using a multi-state variable threshold automatic gain control. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of a receiver using a multi-state variable automatic gain control described herein. The non-processor circuits may include, but are not limited to, a radio receiver, a radio transmitter, signal drivers, clock circuits, power source circuits, and user input devices. As such, these functions may be interpreted as steps of a method for a receiver using a multi-state variable threshold automatic gain control. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Figure 3:
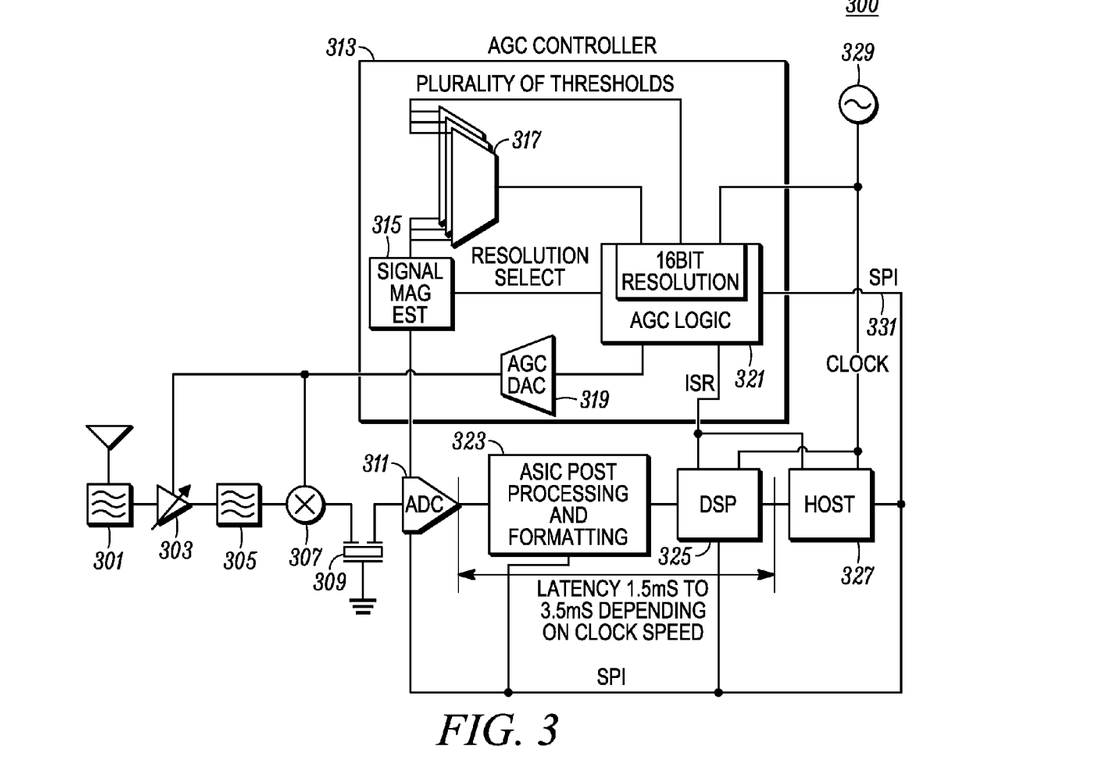
FIG. 3 illustrates a block diagrams of modifications to receiver architecture in accordance with an embodiment of the invention.

FIG. 3 is a block diagram of a modified receiver architecture in accordance with an embodiment of the invention where the modified receiver architecture operates as a multi-state variable threshold AGC for fast channel scanning acquisition. The receiver 300 includes a first filter 301 for filtering a received RF signal and conveying the signal to an LNA 303 having adjustable gain control. The output of the LNA is supplied to a second filter 305 which is output to a mixer 307. The mixer supplies a resultant signal to a crystal filter 309 which is then supplied to Analog-to-Digital Converter (ADC) 311. The output of the ADC is a digital signal which is post processed at stage 323 as necessitated by the subsequent digital signal processor (DSP) 325, including filter, decimation and formatting of the ADC digital signal. An AGC controller 313 includes a signal magnitude estimator 315 that supplies estimates to a plurality of comparators 317 each having a different thresholds (e.g. first and second thresholds) as set by the AGC logic 321. Thus, the AGC controller 321 supplies control information to the AGC DAC 319 that produces an analog control signal to LNA 303 for controlling the gain of at least one amplifier 303 and any other stage requiring AGC control.

In accordance with improvement to the invention, the AGC logic 321 can operate in one of three modes—1) in standard legacy closed loop AGC operation where the gain of amplifier 303 is set by AGC DAC 319 as well known to those skilled in the art; 2) in open loop operation when the amplifier 303 is fixed to a desired gain, the signal magnitude estimator 315 is scaled to detect weak signal RF power, and the AGC logic is configured to send an ISR should a RF carrier be detected, or 3) a hybrid mode where the AGC loop is configured for "closed loop operation", but the AGC logic 321 scales a sub-group of comparator thresholds that trigger "gain increases" so as to detect weak RF power, while the AGC logic 321 is also configured to send an ISR should an RF carrier be detected. Modes 2) and 3) allow the AGC to effectively trigger event-initiated processing sequences of the DSP 325 and host 327. To support this capability the AGC logic 321 may convey a digital control signal to the signal magnitude estimator 315 to increase the resolution of the signal estimate so as to be able to detect weak level RF energy close to usable sensitivity of the receiver. For example, under mode 3) closed loop operation, the nominal magnitude estimate would require only 8 bits of resolution to detect a strong signal RF level that may compression of the amplifier 303 or ADC 311. However, to detect weak RF levels, a 16 bit resolution may be required. Mode 3) is different from mode 2) in that the closed loop AGC operation of mode 3) will set the LNA gain to maximum (not necessarily optimum) when no RF carrier is present on the channel. The advantage of mode 3) is that the thresholds for "gain reduction" can still be set high to protect against receiving strong signal RF signals (which is the primary function of the legacy AGC) while still providing non-legacy AGC small-signal carrier detect functionality.

Moreover, after the AGC logic has increased the resolution of the signal magnitude estimate 315, the thresholds to the plurality of comparators 317 must be resealed to accommodate weak signal detection. Once this is accomplished, the AGC logic is then able to initiate an interrupt service request (ISR) control to both the DSP 325 and the host 327 in order to trigger the execution of secondary process sequences once a weak on channel RF carrier is detected. Until the ISR is initiated, the host is freed from executing sequences necessitated in processing the ADC samples, since the lack of an ISR means no RF carrier is on the received channel. Thus, the host can manage other radio resources as may be required, and the DSP can even be put momentarily into battery save as may be desired. This strategy has the intrinsic benefit of checking for a RF carrier while bypassing the inherent latency in the post processing digital section 323 and the DSP 325, thereby effectively "reducing" RF carrier detect time by up to 3 mS by not having to wait for the ADC samples to cycled through the digital section. When incorporated into a priority scan strategy, this capability can accommodate a priority channel carrier detect while the DSP is still processing the non-priority channel samples, in effect using the inherit delay of the post ADC digital section to "cover" a portion the time needed to effect a RF carrier detect. This minimizes the priority channel audio hole to a point where the interruption in the received audio may become imperceptible to the radio user.

An embodiment of the invention as described herein defines an AGC system and method which digitally emulates a classical analog sum-of-square (SOS) detector, wherein the SOS response is segmented into individual partitions each having its own update rate or bandwidth and step size (attenuation response). Moreover, the "threshold" triggering a particular response is independently tunable, therein facilitating a single section, or a plurality of sections of the digital SOS response to be set for either strong signal conditions for classic closed loop AGC operation or certain thresholds within the plurality of thresholds can be set at protocol specific sensitivity levels to facilitate open loop channel activity carrier detection during scan operations while still providing functional AGC response should an on-channel carrier be present.

The AGC logic 321 can set an ISR flag to the host 327 indicating the presence of a carrier on a channel faster than a carrier could be detected using legacy methods that include post processing and demodulation of the sampled signal provided by the ADC 311. Since the present AGC controllers are configurable to meet very stringent AGC attack times for certain protocol e.g. ~750 uS, it becomes evident that the AGC system can usually set an ISR flag within <1 mS, or less than the latency window of formatting processor 323 and DSP 325. Hence the host 327 can be "flagged" apriori whether the samples to be processed during scan have a detected carrier. If no carrier is detected, no flag is set and the scan routine can proceed without complete processing of the samples through the formatting processor 323 and the DSP 325. This can reduce priority scan audio holes from legacy 15-20 mS duration to <5 mS duration, effectively eliminating the "observable" presence of the audio hole during priority scan.

Figure 4:
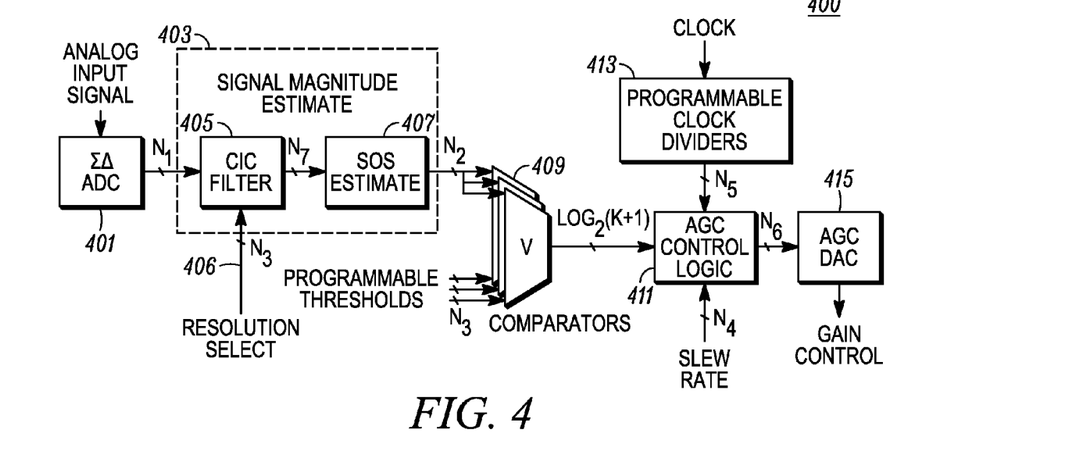
FIG. 4 illustrates a block diagram of a modified automatic gain control system in accordance with an embodiment of the invention.

FIG. 4 illustrates a block diagram of a modified automatic gain control system 400 in accordance with an embodiment of the invention. The received analog signal from the receiver's front end stages is supplied to a sigma delta ADC 401 where the resulting digital signal is input to a signal magnitude estimator 403. The signal magnitude estimator 403 includes both a CIC filter 405 and a sum of squares estimator 407. The CIC filter includes a resolution select for adjusting the decimation rate of the filter. Those skilled in the art will recognize that with an adjustable decimation rate, the CIC filter 405 has a tunable delay and resolution. Hence, in the case of normal AGC operation, a substantially small delay can be used however in the case of carrier detect during the scanning algorithm, a substantially higher resolution can be used. Additionally, if both normal AGC operation and carrier detect are required simultaneously, then the best compromise between delay and resolution can be optimally selected.

The AGC logic 321 incorporates a detector as an on-channel detector. The detector response is determined by the plurality of "thresholds" that partition the respective "sections" of the emulated SOS response. One way to represent the thresholds is relative to the ADC "clip point" which by definition is set to 0 dB. Signal levels below the reference 0 dB indicate the signal strength of the received signal relative to the ADC clip point. Therefore, if it is known what RF input power is required at the antenna to "clip" at the ADC input, it can be determined what threshold setting can be utilized to detect input signal levels at usable sensitivity for the protocol of interest. For example, if the 0 dB AGC threshold corresponding to the ADC clip point correlates to −60 dBm at the antenna, and the usable sensitivity at the antenna for a typical received signal is −122 dBm, then it is known that an AGC threshold setting in the AGC controller of −62 dB (−60 dBm+ 122 dBm) will trigger the AGC at a usable sensitivity. The threshold for each section of the AGC response is independent and is controllable by the SPI 331 from host 327. An example of an AGC response for closed-loop legacy AGC applications which is segmented into "k" sections designed to emulated preexisting SOS detector for a threshold Lo, threshold Hi, update rate and action response is shown in TABLE 1 below.

TABLE 1

| Section | Threshold Lo | Threshold Hi | Update Rate | Action |
|---|---|---|---|---|
| 1 | — | −12 dB | Very fast | Increase Gain |
| 2 | −12 dB | −9 | Fast | Increase Gain |
| 3 | −9 | −6 | — | Do nothing |
| 4 | −6 | −4 | Fast | Reduce Gain |
| 5 | −4 | −2 | Very Fast | Reduce Gain |
| k | −2 | — | Extremely Fast | Reduce Gain |

It should be apparent from the values noted in TABLE 1 that this configuration maximizes the AGC free dynamic range of the receiver 300 allowing for a maximum signal-to-noise (SNR) at the input of the ADC 311 thereby facilitating DSP processing of the received signal. Additionally, the thresholds for each section can be changed to accommodate any given protocol, with any given linearity requirement ranging from approximately 1.4 dB pk-avg to 10 dB pk-avg, and/or the number of segmentations can be increased to emulate a more "continuous" response" if it is required by the system architecture. The "update rate" is usually divided-down from the clock 329 and AGC DAC 319 step size sets the amount of AGC attenuation per least significant bits (LSBs). For nominal operation, each AGC DAC 319 step size is 1 LSB; however, for faster response, the AGC DAC 319 output can be scaled for multiple LSB step sizes depending of SPI programmability.

When the AGC logic 321 is configured in hybrid mode #3 for scan operation, any one or all of the AGC states can be "adapted" for detection of an "on channel" carrier at levels commensurate with the protocol and signal level the system requirements. For example, if the on channel signal that is being checked has usable sensitivity at an equivalent AGC threshold of −62 dB, then the AGC states can be configured with a threshold Lo, Threshold hi, Update rate and action response as denoted in Table 2 below:

TABLE 2

| Section | Threshold lo | Threshold hi | Update Rate | Action |
|---|---|---|---|---|
| 1 | — | −62 dB | Extremely fast | Increase Gain |
| 2 | −62 dB | −55 | Very fast | Increase Gain |
| 3 | −55 | −9 | Fast | Increase |
| 4 | −9 | −4 | — | Do nothing |
| 5 | −4 | −2 | Fast | Reduce Gain |
| k | −2 | — | Extremely Fast | Reduce Gain |

When comparing the Table 2 to the AGC states for "SOS detector Response-nominal configuration in Table 1, it is apparent that the AGC controller is "triggered" at any signal greater than a usable sensitivity (−62 dB), while the SOS configuration triggers at signals approaching the ADC clip point. Additionally, the increase gain response is distributed over a much wider range spanning approximately −62 dB to −55 dB for section 2 and −55 dB to −9 dB for section 3, providing a damped recovery of the AGC even after the channel activity determination has been made. This facilitates transition to a nominal closed loop AGC response if a carrier is detected.

Figure 5:
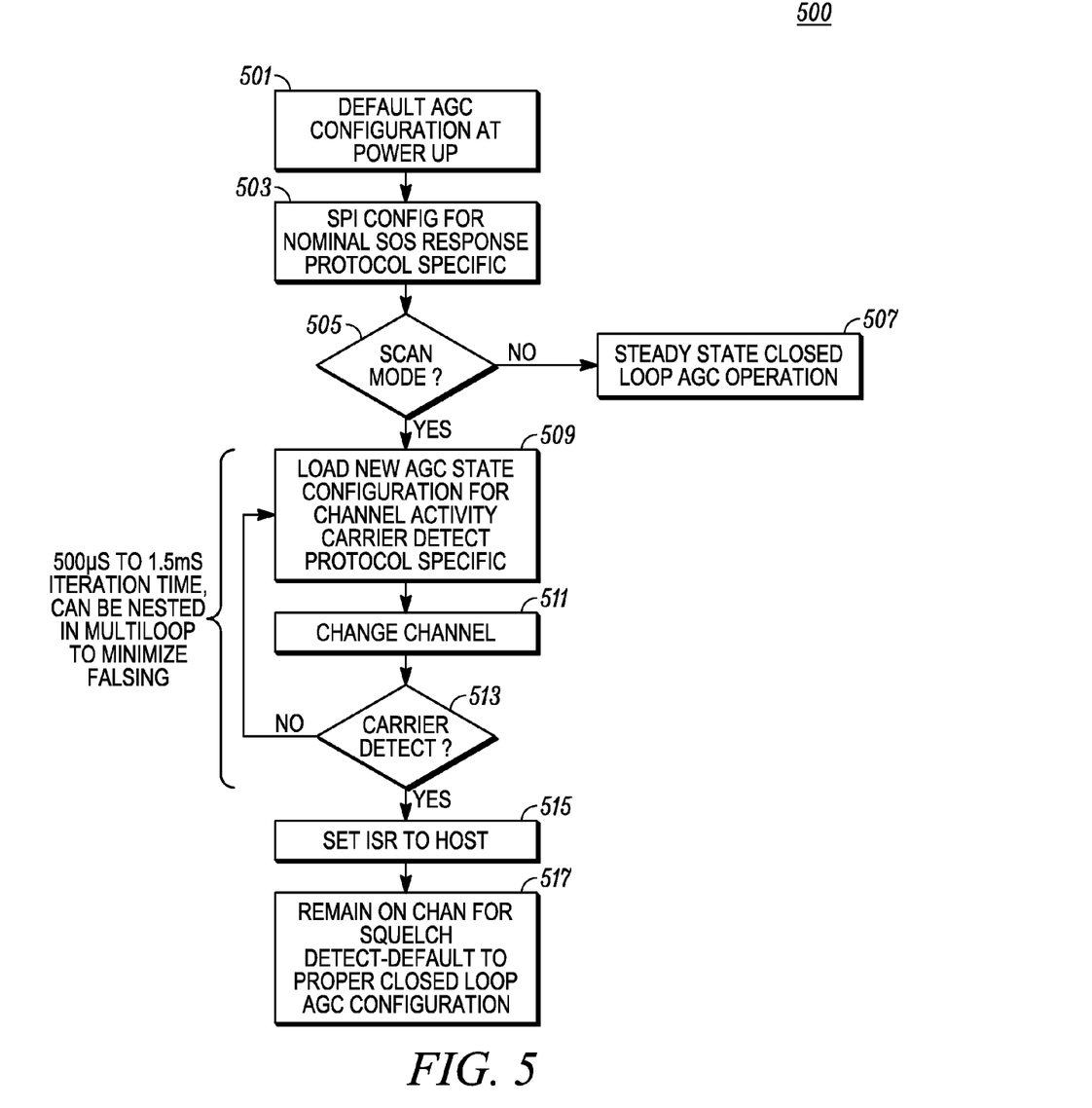
FIG. 5 illustrates a flow chart diagram of a method for providing a multi-state variable threshold AGC for fast channel scanning acquisition in a radio receiver in accordance with an embodiment of the invention.

FIG. 5 illustrates a flow chart diagram of the method for providing a multi-state variable threshold AGC for fast channel scanning acquisition in a radio receiver 500 in accordance with an embodiment of the invention. The method includes the steps of utilizing a default AGC configuration at power up 501. A SPI port is then used to configure AGC logic for a nominal SOS response protocol specific 503. A determination is made if the receiver is in a scan mode 505. If not, then the AGC is set for steady state closed loop operation 507. However, if the receiver is in the scan mode, a new AGC state configuration is loaded for channel activity carrier detection which is protocol specific 509. When the channel is changed during the scan mode 511, if no carrier is detected then a new AGC state configuration may be loaded 509 that correlates to the next channel in the scan list. However, if a carrier is detected then an ISR is sent to the host 515 and the receiver scan remains on the channel for the squelch detect to default to a proper closed loop AGC configuration 517.

Thus, the invention is an a radio receiver that includes a multi-state variable threshold AGC for fast channel scanning acquisition used for detecting the presence of an RF signal at very low power levels approaching usable sensitivity. The detection of the weak RF signal is accomplished without processing of the ADC sampled output by the DSP, the DSP and host resources can be allocated to support of other executable functions or put into battery save mode until "flagged" by the AGC logic to resume processing the ADC sampled output. To accomplish this change in configuration, an AGC controller disables the normal closed loop AGC function and sets the LNA gain to a fixed point which is generally maximum gain. The detector thresholds are reset to very low values (to Usable Sensitivity) using the "resolution select" on the signal estimator and resealing the comparator threshold levels. If a RF signal is detected, instead of increasing attenuation like in legacy AGC system, the AGC logic sets an "interrupt service request" (ISR) to the DSP and host to begin processing of the sampled signal. Once the ISR has been acknowledged by the host processor (via SPI), the AGC logic is reconfigured for normal AGC operation by resetting the "Resolution Select" and increasing the plurality of threshold for strong signal RF, closed loop AGC operation.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A radio receiver having a priority scanning mode of operation for listening on a first channel and scanning at least one priority channel to detect activity comprising:
   an amplifier having an automatic gain control (AGC) operating in open loop and closed loop operational modes for controlling the gain of a receiver analog signal;
   an analog-to-digital converter (ADC) for converting the receiving analog signal to a digital signal;
   a digital signal processor (DSP) for processing the digital signal;
   a host processor for controlling the DSP;
   an AGC system having a signal magnitude estimator for providing a signal strength estimate of the received signal to an AGC controller; and
   wherein the AGC controller operates the receiver amplifier in an open-loop AGC operational mode and sets a first AGC threshold for providing an interrupt service request (ISR) to the DSP if a received signal is detected above the first threshold during a priority scan of the priority channel.

2. A radio receiver having a priority scanning mode as in claim 1, after detecting no priority channel activity the AGC controller includes the steps of:
   disabling the ISR function of the AGC controller;
   setting the amplifier for a closed-loop AGC operational mode;
   utilizing a second threshold for proper gain control; and
   transiting the receiver to the non-priority channel during a priority scan.

3. A radio receiver having a priority scanning mode as in claim 1, wherein the signal magnitude estimator comprises:
   a cascaded integrator comb (CIC) filter with adjustable resolution; and
   a sum-of-squares estimator for receiving a signal from the CIC filter and providing a signal magnitude estimate to at least one comparator.

4. A radio receiver having a priority scanning mode as in claim 2, wherein the CIC filters a signal from the ADC.

5. A radio receiver having a priority scanning mode as in claim 2, wherein the CIC filter has at least a 16 bit resolution.

6. A radio receiver having an AGC as in claim 3, wherein the resolution of the signal magnitude is scaled by adjusted the decimation rate of the cascaded integrator comb (CIC) filter.

7. A radio receiver having a priority scanning mode as in claim 1, wherein the threshold to trigger the AGC controller event is reduced while scanning the at least one priority channel for detecting channel activity.

8. A radio receiver having a priority scanning mode as in claim 1, wherein the threshold to trigger the AGC controller event is increased while scanning the at least one non-priority channel for detecting channel activity.

9. A radio receiver having a priority scanning mode as in claim 1, wherein the host controls the AGC controller, DSP and ADC using a serial port interface (SPI).

10. A radio receiver having an automatic gain control (AGC) system for use in a fast channel scanning acquisition mode comprising:
    at least one receiver amplifier having a variable gain control for controlling the power level of a received RF signal;
    an digital to analog converter (DAC) whose output voltage sets the gain of the receiver amplifier;
    an analog-to-digital converter (ADC) that samples the received signal at a first sample rate and converts the received signal to a digital signal;
    a digital section after the ADC that processes the ADC digital signal to a second sample rate therein generating a sampled digital signal after a finite delay proportional to the second sample rate;
    a digital signal processor (DSP) for final processing the sampled digital signal;
    a host processor for receiving the processed signal;
    a signal magnitude estimator whose output signal is proportional to the received signal level;
    at least one comparator that compares the output of the signal magnitude estimator to a reference threshold and changes state when the signal magnitude estimator output signal exceeds the reference threshold;
    an AGC controller for scaling a reference level of the at least one comparator for substantially low received signal levels;
    a digital signal path between the AGC controller and the host processor whereby the AGC controller may initiate an Interrupt Service Request (ISR) to the host processor when the at least one comparator changes state; and
    wherein the host processor uses the ISR to enable DSP processing of the processed signal to the host processor if a received signal is detected during the fast channel scanning acquisition mode.

11. A radio receiver having an AGC as in claim 10, wherein the DSP does not process the sampled digital signal until being enabled by the host processor.

12. A radio receiver having an multi-state variable AGC as in claim 10, wherein the signal magnitude estimator has scalable resolution.

13. A radio receiver having a AGC as in claim 12, wherein the signal magnitude estimator includes an adjustable cascaded integrator comb (CIC) filter and a sum-of-squares (SOS) estimator.

14. A radio receiver having a AGC as in claim 12, wherein the signal magnitude estimator provides a received signal estimate to a plurality of comparators with a reference threshold of each comparator being independently set by the AGC controller.

15. A radio receiver having an AGC as in claim 13, wherein the resolution of the signal magnitude estimator is scaled by adjusting the decimation rate of the cascaded integrator comb (CIC) filter.

16. A radio receiver having an AGC as in claim 14, wherein after ISR communication with the host processor, the AGC controller performs the steps of:
    adjusting the resolution of the signal magnitude estimator to a second resolution;
    adjusting the plurality of reference thresholds to a plurality of second reference levels; and
    adjusting the output voltage of the DAC relative to the plurality of second reference thresholds for scaling the gain of the at least one receiver amplifier to form a closed loop AGC feedback system.

17. A radio receiver having an AGC as in claim 10, wherein the host processor controls the AGC controller, DSP and ADC using a serial port interface (SPI).

18. A method for minimizing interruptions in the audio stream during channel scanning in a radio receiver comprising the steps of:
controlling the gain of an analog signal in at least one receiver amplifier having an automatic gain control (AGC) performing a closed loop function;
converting the analog signal to a digital signal using an analog-to-digital converter (ADC);
processing the digital signal using a digital signal processor (DSP);
receiving the signal from the DSP using a host processor;
controlling operation of the AGC using a digital received signal magnitude estimate; and
providing an interrupt service request (ISR) to the DSP and the host processor if an radio frequency (RF) signal is detected during a fast channel scanning acquisition mode while minimizing interruptions in the digital signal at the output of the ADC by configuring the AGC controller to detect priority channel activity while the DSP is processing legacy samples on the non-priority channel.

19. A method for minimizing interruptions in the audio stream as in claim 18, further comprising the step of:
disabling the closed loop function of the AGC during channel scanning;
increasing the gain of the at lest one amplifier to a substantially high level;
adjusting the threshold values of an AGC controller to detect weak received signal levels; and
reconfiguring the AGC controller to the closed loop function after the ISR has been acknowledged by the host.

20. A method for minimizing interruptions in the audio stream as in claim 18, further comprising the step of:
providing a signal magnitude estimator in the AGC controller for changing at least one threshold used in detecting a signal at the at least one receiver amplifier.

21. A method for minimizing interruptions in the audio stream as in claim 18, further comprising the step of:
changing the signal magnitude estimator resolution from 8 bits to at least 16 bit resolution.

22. A method for minimizing interruptions in the audio stream as in claim 20, further comprising the step of:
scaling the resolution of the signal magnitude by adjusted the decimation rate of the cascaded integrator comb (CIC) filter.

23. A method for minimizing interruptions in the audio stream as in claim 20, further comprising the step of:
utilizing an adjustable cascaded integrator comb (CIC) filter and a sum-of-squares (SOS) estimator in an AGC controller.

24. A method for minimizing interruptions in the audio steam as in claim 23, further comprising the step of:
providing an estimated AGC signal to at least one comparator for creating a plurality of threshold values to a plurality of comparators that is processed by the AGC controller to determine the AGC (DAC) output voltage.

25. A method for minimizing interruptions in the audio stream as in claim 24, further comprising the steps of:
connecting the DAC to the at least one receiver amplifier for controlling amplifier gain.

26. A method for minimizing interruptions in the audio stream as in claim 18, further comprising the step of:
utilizing the host processor to control an AGC controller, DSP and ADC using a serial port interface (SPI) port.

* * * * *

UNITED STATES PATENT AND TRADEMARK OFFICE
CERTIFICATE OF CORRECTION

| | | |
|---|---|---|
| PATENT NO. | : 7,689,217 B2 | Page 1 of 1 |
| APPLICATION NO. | : 11/694697 | |
| DATED | : March 30, 2010 | |
| INVENTOR(S) | : Ruelke et al. | |

It is certified that error appears in the above-identified patent and that said Letters Patent is hereby corrected as shown below:

On the Title Page, in Field (54), in Title, and in Column 1, Line 4, delete "MEHTOD" and insert -- METHOD --, therefor.

In Fig. 5, Sheet 3 of 3, for Tag "517", in Line 1, delete "CHAN" and insert -- CHANNEL --, therefor.

In Column 1, Line 42, delete "region" and insert -- region. --, therefor.

In Column 3, Line 57, delete "topologies" and insert -- topologies. --, therefor.

In Column 5, Line 62, delete "resealed" and insert -- rescaled --, therefor.

In Column 5, Line 67, delete "weak" and insert -- week --, therefor.

In Column 7, Line 28, delete "below." and insert -- below: --, therefor.

In Column 8, Line 56, delete "resealing" and insert -- rescaling --, therefor.

In Column 10, Line 46, in Claim 13, delete "a AGC" and insert -- an AGC --, therefor.

In Column 10, Line 50, in Claim 14, delete "a AGC" and insert -- an AGC --, therefor.

In Column 11, Line 31, in Claim 19, delete "at lest" and insert -- at least --, therefor.

Signed and Sealed this
Twenty-fifth Day of September, 2012

David J. Kappos
*Director of the United States Patent and Trademark Office*